US012149250B2

(12) United States Patent
Cottin et al.

(10) Patent No.: US 12,149,250 B2
(45) Date of Patent: Nov. 19, 2024

(54) LEVEL SHIFTING DEVICE AND METHOD

(71) Applicant: STMicroelectronics (Grenoble 2) SAS, Grenoble (FR)

(72) Inventors: Denis Cottin, Crolles (FR); Fabrice Romain, Voreppe (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 228 days.

(21) Appl. No.: 17/412,991

(22) Filed: Aug. 26, 2021

(65) Prior Publication Data

US 2022/0069811 A1 Mar. 3, 2022

(30) Foreign Application Priority Data

Aug. 31, 2020 (FR) ...................................... 2008826

(51) Int. Cl.
*H03K 3/356* (2006.01)
*G09G 3/3225* (2016.01)
*H03K 19/0185* (2006.01)

(52) U.S. Cl.
CPC ..... *H03K 3/356113* (2013.01); *G09G 3/3225* (2013.01); *H03K 3/35613* (2013.01); *H03K 19/018521* (2013.01); *G09G 2310/0289* (2013.01); *G09G 2380/10* (2013.01)

(58) Field of Classification Search
None
See application file for complete search history.

(56) References Cited

U.S. PATENT DOCUMENTS

| 5,204,557 | A | 4/1993 | Nguyen | |
|---|---|---|---|---|
| 5,559,464 | A | 9/1996 | Orii et al. | |
| 6,028,573 | A * | 2/2000 | Orita | H03K 17/04123 345/60 |
| 8,416,006 | B1 * | 4/2013 | Timonen | G09G 3/3677 327/108 |
| 2005/0088396 | A1 * | 4/2005 | Tobita | G09G 3/3688 345/100 |
| 2007/0085566 | A1 | 4/2007 | Koto et al. | |
| 2011/0298777 | A1 * | 12/2011 | Tsuchi | G09G 3/3688 345/211 |

(Continued)

FOREIGN PATENT DOCUMENTS

| CN | 110706635 A * | 1/2020 | ........... G09G 3/2092 |
|---|---|---|---|
| FR | 2797118 A1 | 2/2001 | |

OTHER PUBLICATIONS

INPI Search Report and Written Opinion for FR Appl. No. 2008826 dated May 10, 2021 (10 pages).

*Primary Examiner* — Benjamin X Casarez
(74) *Attorney, Agent, or Firm* — Crowe & Dunlevy

(57) ABSTRACT

An output potential level among two first levels is delivered according to an input level among two second levels. The output potential level is delivered at a first node connecting together first and second transistors electrically in series between two second nodes of application of the first levels. A first DC voltage defining a high limit for the control voltage of the first transistor is delivered by a first voltage generator powered by one of the second nodes. A second DC voltage defining a high limit for the control voltage of the second transistor is delivered by a second voltage generator controlled by a value representative of the first voltage and powered between the second nodes.

9 Claims, 6 Drawing Sheets

(56) References Cited

U.S. PATENT DOCUMENTS

| | | | | |
|---|---|---|---|---|
| 2013/0088473 | A1* | 4/2013 | Tsuchi | G09G 3/3291 |
| | | | | 330/257 |
| 2014/0306684 | A1 | 10/2014 | Cheng et al. | |
| 2015/0279297 | A1* | 10/2015 | Nakano | G06F 3/0446 |
| | | | | 345/94 |
| 2017/0154560 | A1* | 6/2017 | Takahashi | G06F 1/1626 |
| 2018/0061342 | A1* | 3/2018 | Abe | G09G 3/3648 |
| 2018/0091121 | A1* | 3/2018 | Yamamoto | H03K 3/356139 |
| 2019/0073940 | A1* | 3/2019 | Morita | H03F 1/223 |
| 2019/0165771 | A1* | 5/2019 | Masaoka | H03K 19/018507 |
| 2020/0312264 | A1* | 10/2020 | Tsuchi | G09G 3/3648 |
| 2021/0020137 | A1* | 1/2021 | Jang | G09G 3/3688 |

\* cited by examiner

LEVEL SHIFTING DEVICE AND METHOD

PRIORITY CLAIM

This application claims the priority benefit of French Application for Patent No. 2008826, filed on Aug. 31, 2020, the content of which is hereby incorporated by reference in its entirety to the maximum extent allowable by law.

TECHNICAL FIELD

The present disclosure generally concerns electronic devices such as integrated circuits and, in particular, logic level shifting or logic level translation devices (level shifters).

BACKGROUND

A logic level shifter is a circuit provided to receive a logic input signal and to deliver a logic output signal representative of the logic input signal, the logic output signal having potential levels that may be different from those of the input signal. The potential levels of a logic signal correspond to the respective logic states, for example zero and one, or low and high, of the logic signal. In other words, the level of each of the input and output logic signals is among two potential levels.

For one of the input levels, the level shifter sets the output potential to one of the output levels and, for the other one of the input levels, the level shifter sets the output potential to other one of the output levels. In other words, the level shifter selects the output potential level among the two output levels, different from the two input levels, according to the level taken by the logic input signal.

There is a need to improve known logic level shifters and known logic level shifting methods.

SUMMARY

An embodiment overcomes all or part of the disadvantages of known logic level shifters.

An embodiment overcomes all or part of the disadvantages of known logic level shifting methods.

An embodiment provides a method of delivery of an output potential level among two first levels according to an input level among two second levels, comprising: delivering the output level by a first node connecting together first and second transistors electrically in series between two second nodes of application of the first levels; delivering, by a first voltage generator powered by one of the second nodes, of a first DC voltage defining a high limit for the control voltage of the first transistor; and delivering, by a second voltage generator controlled by a value representative to the first voltage and powered between the second nodes, of a second DC voltage defining a high limit for the control voltage of the second transistor.

An embodiment provides a device configured to deliver an output potential level among two first levels according to an input level among two second levels, comprising: first and second transistors connected together by a first output level delivery node and electrically in series between second nodes of application of the first levels; a first voltage generator powered by one of the second nodes and configured to deliver a first DC voltage defining a high limit for the control voltage of the first transistor; and a second voltage generator controlled by a value representative of the first voltage, powered between the second nodes and configured to deliver a second DC voltage defining a high limit for the control voltage of the second transistor.

According to an embodiment: a first signal representative of a desired state of the second transistor is referenced to the potential of said one of the second nodes; and preferably, the first signal is generated from a second signal representative of a desired state of the first transistor and referenced to a reference potential of the second levels.

According to an embodiment: the first generator comprises a third transistor configured to conduct a first current for powering the first generator; and the second generator comprises a fourth transistor forming a current mirror with the third transistor and configured to conduct a second current for powering the second generator.

According to an embodiment: the first generator comprises, electrically in series with the third transistor between said one of the second nodes and a third node for delivering the first voltage, a first element having a predefined voltage drop at the passage of the first current, the first element preferably comprising a diode; and the second generator comprises a second element having a predefined voltage drop at the passage of the second current, coupling a fourth node to the other of the second nodes, and preferably comprising a fifth transistor and a diode electrically in series.

According to an embodiment: one or a plurality of transistor control circuits comprises or each comprise: first, second, and third additional transistors electrically in series in this order between said one of the second nodes and an additional node of application of one of the second levels, the second additional transistor having its control coupled to a node for delivering the first voltage; a connection node between the first and second additional transistors, coupled to a control terminal of the transistor controlled by the first circuit; and/or one or a plurality of second transistor control circuits comprises or each comprise fourth, fifth, and sixth additional transistors electrically in series in this order between said one of the second nodes and the other one of the second nodes, the fifth additional transistor having its control coupled to a node for delivering the second voltage; and a connection node between the fifth and sixth additional transistors coupled to a transistor control terminal controlled by the second circuit.

According to an embodiment, a circuit for controlling the first transistor is made of the or of one of the first circuits and/or a circuit for controlling the second transistor is formed of the or of one of the second circuits.

According to an embodiment, the first signal controls the fourth additional transistor of the circuit for controlling the second transistor.

According to an embodiment, the first signal is generated by another one of the first circuits having its third additional transistor controlled by the second signal.

According to an embodiment: the third additional transistor of the circuit for controlling the first transistor is controlled by a signal which is the inverse of the second signal; and/or the fourth additional transistor of the circuit for controlling the second transistor is controlled by a signal which is the inverse of the first signal.

According to an embodiment: the signal which is the inverse of the first signal is delivered by still another one of the first circuits having its third additional transistor controlled by the signal which is the inverse of the second signal and its first additional transistor controlled by said another one or the first circuits; and the first additional transistor of said another one of the first circuits is controlled by said still another one of the first circuits.

According to an embodiment, the fourth additional transistor of another one of the second circuits is controlled by the signal which is the inverse of the first signal, and the sixth transistor of the control circuit of the second switch is controlled by said another one of the second circuits.

According to an embodiment: still another one of the second circuits has its fourth additional transistor controlled by the first signal and has its sixth additional transistor controlled by said another one of the second circuits; and the sixth additional transistor of said another one of the second circuits is controlled by said still another one of the second circuits.

According to an embodiment, a value of the first DC voltage is selected according to the level of an enable/disable logic signal between a value smaller than a voltage threshold for the control of the first transistor and a value greater than the voltage threshold.

According to an embodiment, the output potential level controls a display screen, preferably of OLED type.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, display screens, display screen control circuits, digital modules for generating display screen control signals, and power supply modules, are not described in detail, the embodiments being compatible with such usual components.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Unless specified otherwise, ordinal numerals such as "first", "second", etc. are only used to distinguish elements from one another. In particular, these adjectives do not limit the described devices and methods to a specific order of these elements.

Figure 1:
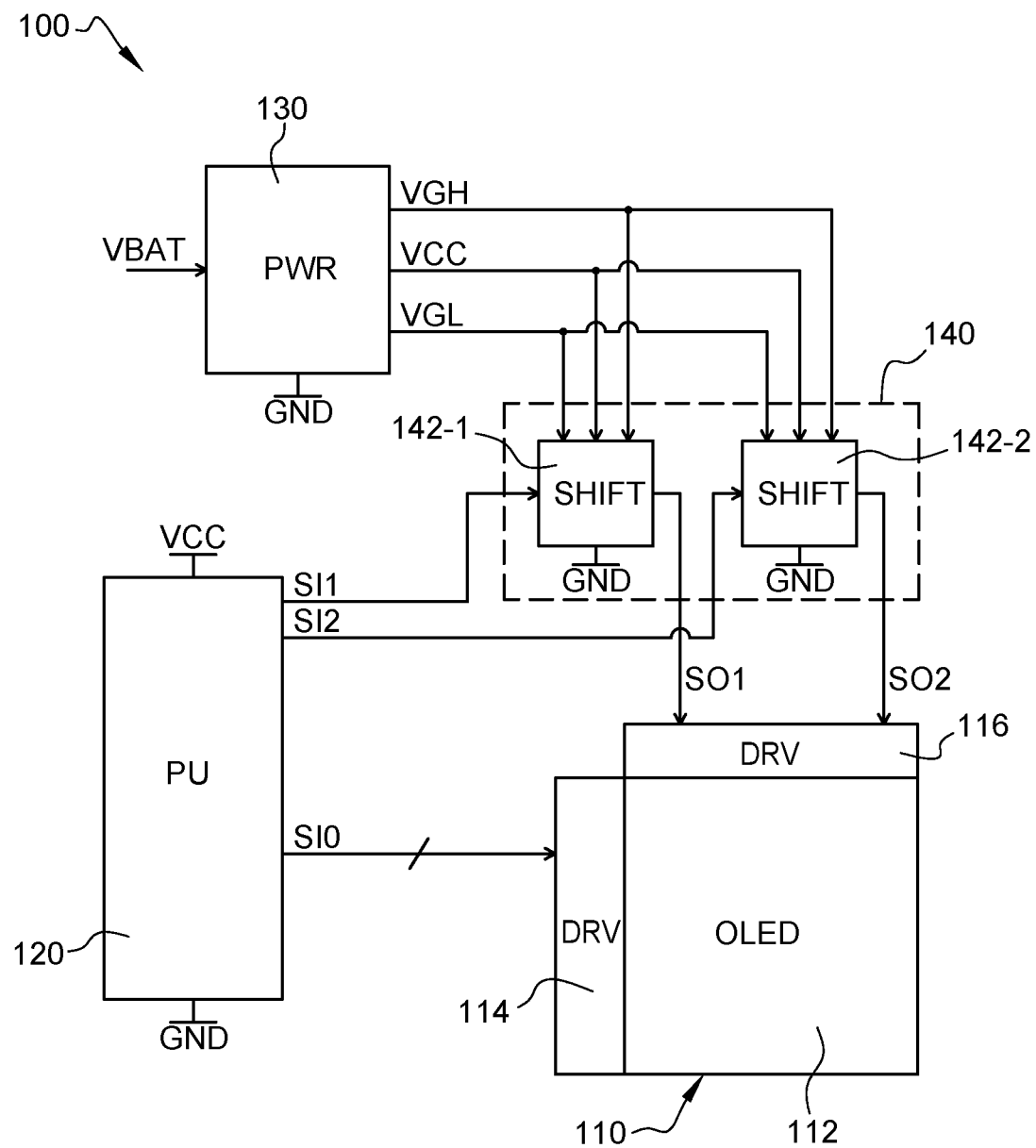
FIG. 1 schematically shows an example of a device to which the described embodiments apply.

FIG. 1 schematically shows an example of a device 100 to which the described embodiments apply.

In the present example, device 100 is provided to display images. Device 100 may be used in a motor vehicle to display various data, typically for the driver. The motor vehicle may comprise a plurality of devices such as device 100.

Device 100 comprises a display screen 110 for displaying images. Display screen 110 typically comprises an array 112 of pixels, such as an array of organic light-emitting diodes (OLEDs). Array 112, for example, results from a printing method. As an example, array 112 has a resolution known as "4K resolution" or more, that is, of 3,840 or more by 2,160 or more pixels.

Display screen 110 further comprises control circuits 114, 116 (DRV) typically configured to respectively control the rows and the columns of array 112. In the shown example, circuit 116 controls a scanning of the rows of array 112.

Device 100 further comprises a digital unit 120 (PU) comprising, for example, a sequential digital data processing unit, such as a microprocessor or microcontroller and, also for example, a memory containing a program. Digital unit 120 is configured, in particular is programmed, to supply control circuit 114 with control signals SI0 to be applied to display screen 110, and control signals SIi (SI1, SI2) for control circuit 116. The number of signals SIi is equal to two in the shown example and typically is, in other examples, equal to four or eight. Control signals SIi may have a frequency in the order of 133 kHz.

Device 100 further comprises a power supply module 130 (PWR). Power supply module 130 is powered with a voltage VBAT, typically delivered by a battery, not shown. Power supply module 130 delivers, between a node VCC and a node GND of application of a reference potential, such as the ground, a voltage for powering digital unit 120. In other words, power supply module 130 applies power supply potentials to nodes VCC and GND, digital unit 120 being coupled, preferably connected, to nodes VCC and GND.

Control signals SIi each take their level among the two levels corresponding to the potentials of respective nodes VCC and GND. In other words, the potential levels taken by each control signal SIi are, outside of rising or falling edges of the signal, equal, or substantially equal, to the potentials of nodes VCC and GND. As an example, the voltage between nodes VCC and GND is equal to 3.3 V or to approximately 3.3 V.

Power supply module 130 further delivers, on nodes VGH and VGL, potentials for powering display screen 110. The potentials of nodes VGH and VGL are different from those of respective nodes VCC and GND. Typically, at least the potential of node VGH is greater than the potential of node VCC, for example, the potential of node VGH is greater than 20 V (as compared with the reference potential of node GND).

Device 100 further comprises a bank 140 of level shifters, or level shifter block, receiving signals SIi. Bank 140 is coupled, preferably connected, to control circuit 116. More particularly, for each of signals SIi, bank 140 comprises a level shifter 142-*i* (142-1, 142-2, SHIFT) coupling control circuit 116 to an output of digital unit 120 on which digital unit 120 delivers signal SIi. Each level shifter 142-*i* is coupled, preferably connected, to the four nodes GND, VCC, VGH, and VGL.

For each of signals SIi, level shifter 142-*i* supplies control circuit 116 with an output potential level among the two levels corresponding to the potential of nodes VGH and VGL, according to the level of input signal SIi. In other words, each level shifter 142-*i* translates the concerned signal SIi into a signal SOi (SO1, SO2) taking its levels among the levels of nodes VGH and VGL. Signals SIi thus have levels compatible with the application of these signals to display screen 110 by control circuit 116.

Although a specific example of application of level shifters has been described hereabove, this example is not limiting. The described embodiments are compatible with any application where logic signals are transmitted between two circuits using different respective potential levels.

Figure 2:
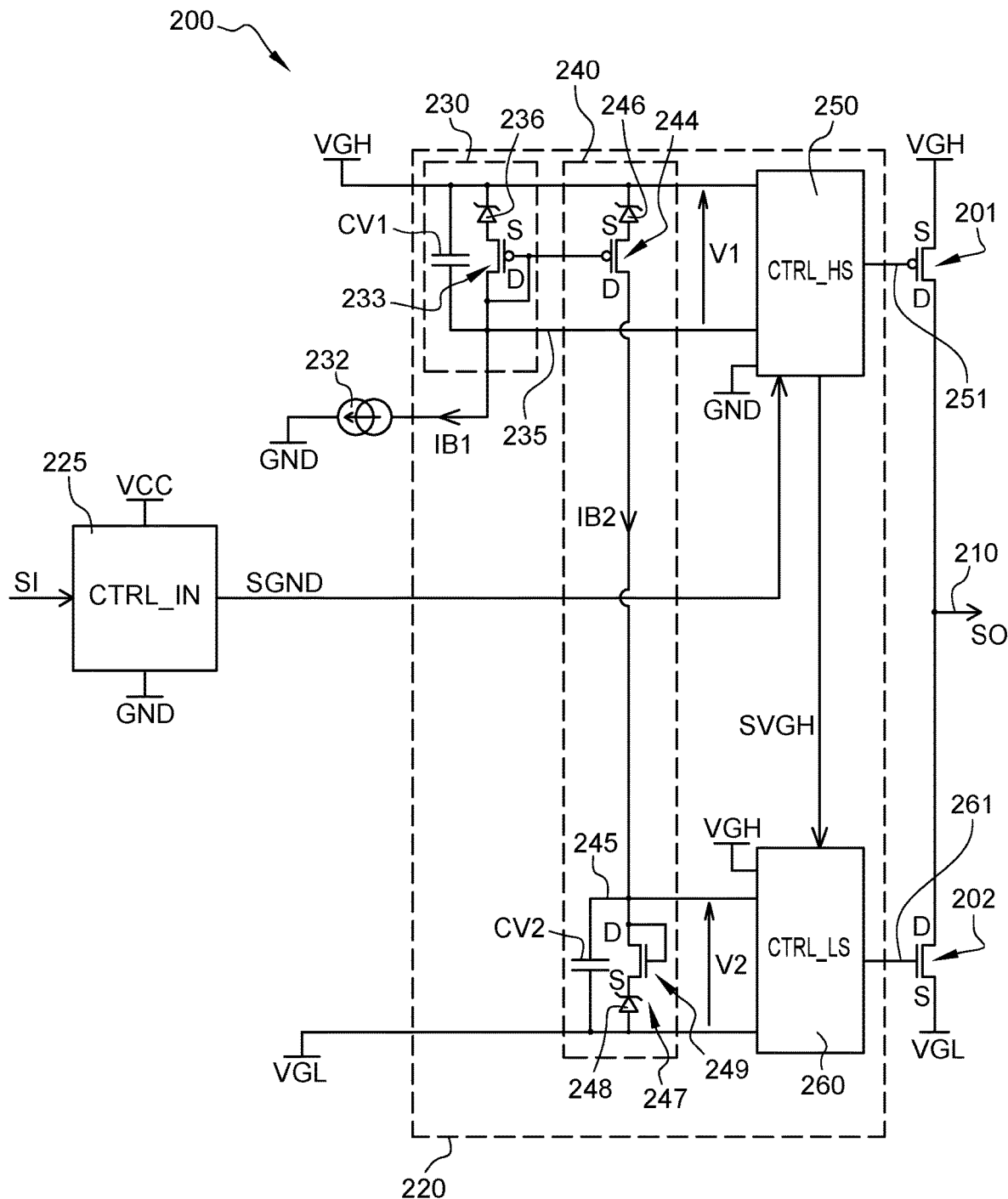
FIG. 2 schematically shows an embodiment of a level shifter.

FIG. 2 schematically shows an embodiment of a level shifter 200, that is, a logic level shifting device. Each of the level shifters 142-*i* of the device 100 of FIG. 1 may be replaced with level shifter 200. Level shifter 200 receives an input signal SI that may be one of the signals SIi of the device 100 of FIG. 1, and delivers an output signal SO that may be one of the signals SOi of the device 100 of FIG. 1.

Level shifter 200 comprises two transistors 201 and 202 connected electrically in series between nodes VGH and VGL. Output signal SO is delivered by level shifter 200 on a connection node 210 between the two transistors 201 and 202.

Preferably, transistors 201 and 202 are field-effect transistors with respective P-type and N-type channels, P-channel transistor 201 being located on the side of node VGH. As a variant, other types of transistors, or field-effect transistors having channels of other conductivity types N, P, are possible.

Level shifter 200 comprises a circuit 220 for controlling the gates of transistors 201 and 202. More particularly, circuit 220 is configured to apply, to outputs 251 and 261 of circuit 220, inverse control signals to respective transistors 201 and 202. Inverse control signals means that the control signals applied to transistors 201 and 202 are such that, when one of transistors 201 and 202 is on, the other one is off. Transistors 201 and 202 may also be simultaneously turned off. When transistor 201 is on, the output level of level shifter 200 corresponds to the potential of node VGH. When transistor 202 is on, the output level of level shifter 200 corresponds to the potential of node VGL.

Circuit 220 receives a logic signal SGND representative of the desired output level of level shifter 200. Thus, logic signal SGND is representative of a desired state of transistors 201 and/or 202. Logic signal SGND is referenced to the potential of node GND. Logic signal referenced to a potential means that the two logic levels of this signal each have a constant difference with this potential, where one of the differences may be zero. In case of a variation of this potential, the levels of the logic signal thus have the same variation. This potential thus plays the role of a reference potential for the levels of the logic signal.

Level shifter 200 may comprise a logic circuit 225 (CTRL_IN), powered between nodes VCC and GND. Logic circuit 225 receives an input signal SI of level shifter 200. Logic circuit 225 outputs signal SGND from signal SI. Logic circuit 225 may comprise an inverter or a buffer receiving signal SI and outputting signal SGND.

In the shown example, a portion 230 of circuit 220 comprises, electrically in series between node VGH and a node 235, a diode 236 and a transistor 233, preferably, a P-channel field-effect transistor. Diode 236 may comprise one or a plurality of diodes and/or one of a plurality of diode-assembled field-effect transistors, electrically in series and/or in parallel. Transistor 233 is diode-assembled, that is, it has drain and gate terminals coupled together, preferably connected together. Transistor 233 has a source terminal (S) facing node VGH. The cathode of diode 236 faces node VGH. Node 235 is coupled, preferably connected, to a current source 232. For example, current source 232 couples circuit 220 to node GND.

In operation, the current source 232 samples from node VGH a current IB1 flowing through portion 230. Portion 230 then delivers a DC voltage V1 between node VGH and a node 235. In other words, portion 230 forms a voltage generator. As an example, DC voltage V1 is in the range from 4.8 to 4.9 V. As an example, current IB1 has a value in the range from 1 to 10 μA, for example, equal to 2 μA or approximately 2 μA.

Preferably, a capacitive element CV1 is provided between nodes VGH and 235, that is, in parallel with the series association of transistor 233 and of diode 236.

The shown example is not limiting. In a variant, diode 236 may be replaced with any element having a predefined voltage drop at the passage of a current such as current IB1. Such an element may comprise one or a plurality of components such as resistors, transistors, diodes, or Zener diodes, etc., in series and/or in parallel. Voltage generator 230 may also be replaced with any generator capable of generating voltage V1 between nodes VGH and 235 and powered with a current supplied by node VGH, such as current IB1. Preferably, such a generator is powered between nodes VGH and GND, that is, the current supplied by node VGH reaches node GND.

Circuit 220 comprises a module 250 (CTRL_HS) for controlling transistor 201. Module 250 is thus coupled, preferably connected, to a control terminal of transistor 201 (a gate terminal in the example of a field-effect transistor). Module 250 receives signal SGND. Module 250 is coupled, preferably connected, to node GND. Module 250 is also coupled, preferably connected, to nodes VGH and 235.

In operation, module 250 receives voltage V1 and delivers a control voltage VGSP (not shown) at node 251 to transistor 201. Preferably, the control voltage VGSP of transistor 201 takes two values for setting transistor 201 to the respective on and off state, according to the desired state of this transistor.

Module 250 is configured so that the control voltage VGSP of transistor 201 is always smaller than or equal to, in absolute value, voltage V1. In other words, voltage V1 forms a high limit of the control voltage VGSP of transistor 201. In other words, voltage V1 forms a high limit of the absolute value |VGSP| of control voltage VGSP.

Preferably, transistor 201 has a source terminal (S) located on the side of node VGH. The control voltage VGSP of transistor 201 is then applied between the source and gate terminals of transistor 201. The turn-off value taken by the control voltage may be close to zero, that is, module 250 applies to the gate terminal of transistor 201 a potential substantially equal to that of node VGH. The turn-on value taken by the control voltage may be equal to voltage V1, or to a predefined value smaller than voltage V1, for example, having a constant difference with voltage V1.

It is desirable to limit the control voltage between the gate and the source of transistor 201 to avoid damaging the transistor. For example, the application to transistor 201 of a control voltage close to the voltage between nodes VGH and GND would be likely to damage the transistor.

Preferably, a portion 240 of circuit 220 comprises, electrically in series between node VGH and a node 245, a diode 246 and a transistor 244, preferably a P-channel field-effect transistor. Transistor 244 is preferably assembled as a current mirror with transistor 233 and has a source terminal (S) located on the side of node VGH. Diode 246 has its cathode facing node VGH.

Preferably, transistor 244 has its control terminal coupled, preferably connected, to the control and drain terminals, coupled together, of the transistor 233 of voltage generator 230.

More preferably: diodes 236 and 246 are, to within manufacturing tolerances, identical; diodes 236 and 246 are located between node VGH and the source terminals (S) of respective transistors 233 and 244; and transistors 233 and 244 have, to within manufacturing tolerances, a predefined dimension ratio with respect to each other or, more preferably, are identical.

In operation, current IB1 flows through transistor 233. Transistor 244 conducts a current IB2 supplied by node VGH. The value of current IB2 has with that of current IB1 a ratio equal or substantially equal to the dimension ratio between transistors 244 and 233. In other words, transistors 233 and 244 form a current mirror. The values of currents IB1 and IB2 are preferably equal or substantially equal.

The shown example of a current mirror is not limiting. The current mirror may be any current mirror capable of supplying current IB2 from current IB1. In another example, transistors 233 and 244 may be directly connected to node VGH. In still another example, diodes 236 and 246 are replaced with two respective elements capable of causing a same voltage drop at the passage of respective currents IB1 and IB2.

Portion 240 further comprises an assembly 247 coupling nodes 245 and VGL. Assembly 247 comprises, electrically in series between nodes 245 and VGL, a diode 248 and a diode-assembled transistor 249. Transistor 249 is preferably an N-channel field-effect transistor. Transistor 249 then has its source facing node VGL. Diode 248 has its cathode facing node VGL.

In operation, current IB2 flows through assembly 247. Assembly 247 causes a predefined voltage drop at the passing of current IB2. Such a voltage drop forms a DC voltage V2. In a variant, assembly 247 may be replaced with any element having a predefined voltage drop at the passing of a current such as current IB2.

DC voltage V2 is delivered on nodes 245 and VGL from the current IB2 flowing between nodes VGH and VGL. In other words, portion 240 forms a generator of voltage V2 powered between nodes VGH and VGL by current IB2. As an example, DC voltage V2 is equal, or substantially equal, to voltage V1.

Preferably, a capacitive element CV2 is provided between nodes VGL and 245, that is, in parallel with assembly 247.

In the shown example, generator 240 of voltage V2 receives voltage V1 between node VGH and the control terminal of transistor 244. Thus, voltage V1 controls voltage generator 240. This example is not limiting, voltage generator 240 may be replaced with any generator: capable of generating voltage V2 between nodes 245 and VGL; powered between nodes VGH and VGL; and controlled by voltage V1 or by any value representative of voltage V1, such as, for example, a value of current IB1.

Circuit 220 further comprises a module 260 (CTRL_LS) for controlling transistor 202. Module 260 is coupled, preferably connected, to nodes 245 and VGL. In operation, module 260 receives voltage V2 and delivers a control voltage VGSN (not shown) at node 261 to transistor 202. Module 260 is configured so that voltage V2 forms a high limit of the control voltage VGSN of transistor 202.

Preferably, transistor 202 has a source terminal (S) located on the side of node VGL. The control voltage VGSN of transistor 202 is then applied between the source and gate terminals of transistor 202. The turn-off value taken by the control voltage may be close to zero, that is, module 260 applies to the gate terminal of transistor 201 a potential substantially equal to that of node VGL. The turn-on value taken by the control voltage may be equal to voltage V2, or to a predefined value smaller than voltage V2, for example, having a constant difference with voltage V2. It is thus avoided to risk damaging transistor 202.

It could have been devised to provide, instead of generator 240, another generator of voltage V2 powered between nodes VGL and GND. For example, in cases where the potential of node VGL is greater than that of node GND, it could have been devised for this other generator to be similar to voltage generator 230. In cases where the potential of node VGL is smaller than that of node GND, it could have been provided for this other generator to differ from voltage generator 230 in that the N and P conductivity types, in particular the cathodes and anodes of the diodes, are exchanged.

As a comparison, the fact of providing generator 240 powered between nodes VGH and VGL and controlled by a voltage representative of voltage V1, enables to deliver DC voltage V2 for limiting the control voltage VGSN of transistor 202 with a similar generator 240 when the potential of node VGL is greater than, substantially equal to, or smaller than that of node GND. In particular, the same level shifter 200 may be used for values of the potential of node VGL capable of being positive or negative (with respect to the reference potential of node GND). As an example, the potential of node VGL may take any value between −10 V and 13 V. Further, this enables the potential of node VGL to vary during the operation and, in particular, to be able to change sign, which is desired in certain applications, in particular image display.

Module 260 receives a signal SVGH representative of the desired state of transistor 202. Signal SVGH is preferably referenced with respect to the potential of node VGH. Module 260 is then coupled, preferably connected, to node VGH. Preferably, signal SVGH is delivered by module 250, more preferably from signal SGND. As a variant, it may be provided for circuit 220 to deliver signal SVGH, preferably referenced with respect to the potential of node VGH or VGL.

Figure 3:
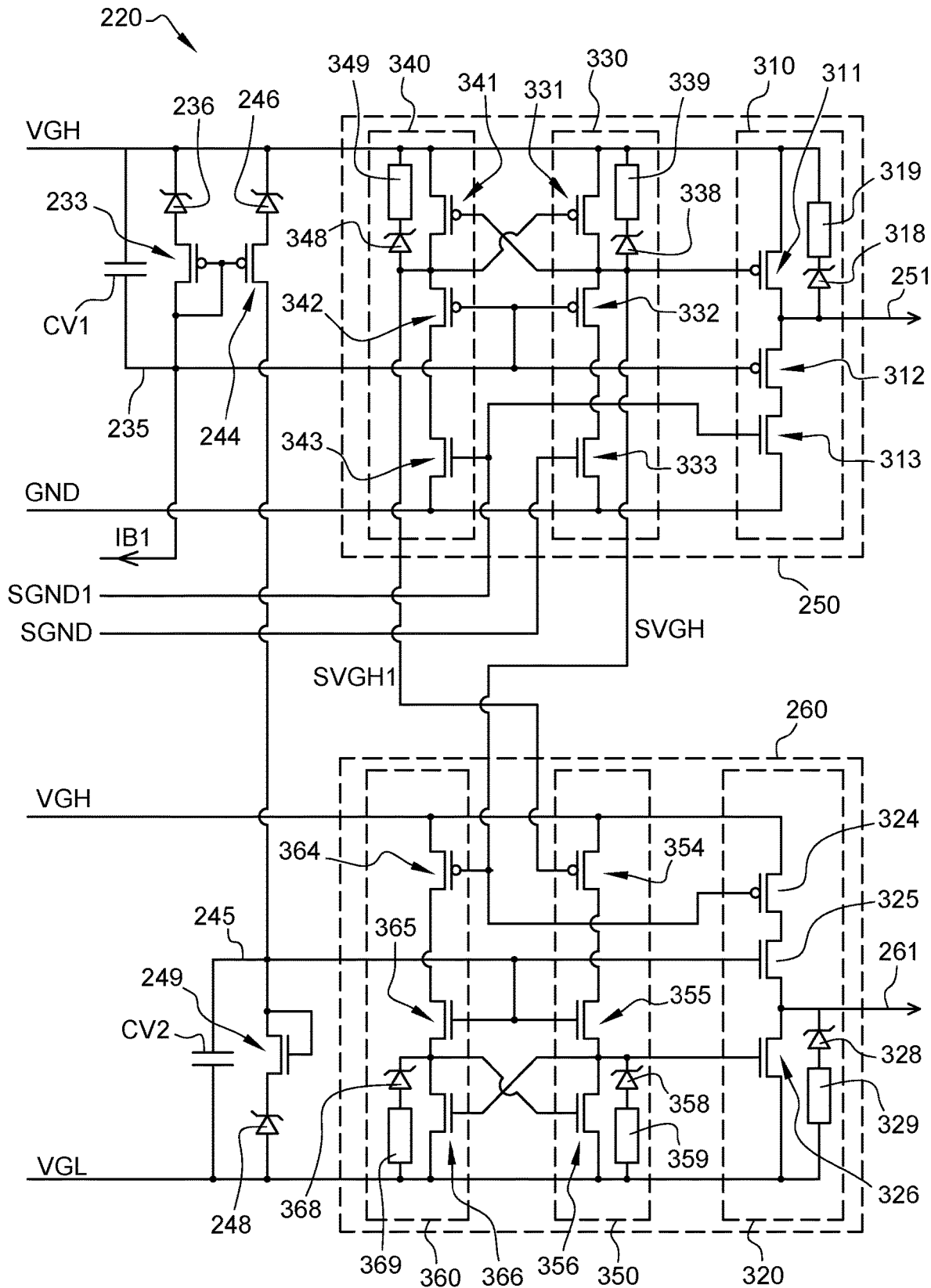
FIG. 3 schematically shows an embodiment of a circuit of the level shifter of FIG. 2.

FIG. 3 schematically shows an embodiment of the circuit 220 of the level shifter 200 of FIG. 2. More particularly, this example comprises elements described hereabove in relation with FIG. 2. These elements are not described again. Specific examples of modules 250 and 260 of circuit 220 are detailed. Outputs 251 and 261 of circuit 220 are coupled, preferably connected, to the control terminals of respective transistors 201 and 202 (FIG. 2).

Module 250 comprises circuits 310, 330, 340. Each circuit 310, 330, 340 comprises, connected electrically in series in this order between nodes VGH and GND: a first respective transistor 311, 331, 341; a second respective transistor 312, 332, 342; and a third respective transistor 313, 333, 343. The second transistors 312, 332, and 342 each have a control terminal coupled, preferably connected, to node 235 for delivering DC voltage V1.

Preferably, the first and second transistors 311, 312, 331, 332, 341, and 342 are P-channel field-effect transistors and have their source terminals located on the side of node VGH. Preferably, the third transistors 313, 333, and 343 are N-channel field-effect transistors and have their source terminals located on the side of node GND.

Each of circuits 310, 330, and 340 generates a transistor control signal, in other words, forms a transistor control circuit. Each of circuits 310, 330, and 340 has a transistor control output formed by a connection node between the first and second transistors, respectively, 311 and 312, 331 and 332, and 341 and 342.

More particularly, circuit 310 controls transistor 201 (FIG. 2), circuit 330 controls transistors 311 and 341, and circuit 340 controls transistor 331.

Preferably, each of circuits 310, 330, and 340 comprises, in series between its transistor control output and node VGH, a Zener diode, respectively 318, 338, and 348, and a resistive element such as a resistor, respectively 319, 339, and 349. Zener diodes 318, 338, and 348 have their cathodes facing node VGH.

In each of circuits 310, 330, and 340, the first transistor, respectively 311, 331, and 341, and the third transistor, respectively 313, 333, and 343, are reverse-controlled. Circuits 310, 330, and 340 are powered between nodes VGH and GND, in other words, the currents of charge/discharge of the gates of the transistors controlled by these circuits are supplied by nodes VGH and GND.

When the third transistor, respectively 313, 333, and 343, is in the on state, the second transistor, respectively 312, 332, and 342 holds the potential of the connection node between the first transistor, respectively 311, 331, and 341, and the second transistor, respectively 312, 332, and 342, at a value greater than that of the potential of node 235, for example, equal to that of the potential of node 235 plus a threshold turn-on voltage of the second transistor, respectively 312, 332, and 342. Thus, the transistor control voltage delivered by each of circuits 310, 330, and 340 is limited by voltage V1.

In each of circuits 310, 330, and 340, Zener diodes 318, 338, and 348 are used to avoid for the control provided by the circuit to be floating when the first transistor, respectively 311, 331, and 341, and the second transistor, respectively 312, 332, and 342, are in the off state. The values of Zener diodes 318, 338, and 348 are selected so that the transistor control voltage delivered by the concerned circuit 310, 330, or 340 when the Zener diode is on is sufficient to turn on the concerned controlled transistor (that is, greater than a control voltage threshold of the transistor), and to limit, that is, clamp, this control voltage to values smaller than a control voltage threshold admissible by the controlled transistor, with no deterioration. The shown example is not limiting, Zener diodes 318, 338, and 348 and resistors 319, 339, and 349 may be omitted or replaced with any element capable of avoiding for the outputs of circuits 310, 330, and 340 to be floating.

The third transistor 333 of circuit 330 is controlled by signal SGND. The third transistor 313 of circuit 310 is controlled by a signal SGND1.

Signal SGND1 is the inverse of signal SGND and is referenced to the potential of node GND. Signal SGND1 may be delivered by an inverter, not shown in FIG. 3, referenced to the potential of node GND and receiving signal SGND. The third transistor 343 of circuit 340 is controlled by signal SGND1.

In the shown example, circuits 330 and 340 control a state of the first transistor 311 of circuit 301 for controlling transistor 201 (FIG. 2) which is the inverse of the state of the third transistor 313 controlled by signal SGND1. This example is not limiting, and circuits 330 and 340 may be replaced with any circuit configured to supply first transistor 311 with a control signal in a state which is the inverse of the state of the third transistor 313.

In the shown example, circuit 340 controls the first transistor 331 of circuit 330 to a state which is the inverse of that imposed to the third transistor 333 of circuit 330 by signal SGND. This example is not limiting, and circuit 340 may be replaced with any circuit configured to control the first transistor 331 of circuit 330 to a state which is the inverse of that of third transistor 333.

In the shown example, circuit 330 controls the first transistor 341 of circuit 340 to a state which is the inverse of the state imposed to the third transistor 343 of circuit 340 by signal SGND1. An advantage is that the first transistors 331 and 341 of circuits 330 and 340 form a latch enabling to stabilize the state of the control signal delivered to transistor 201.

Preferably, the signal SVGH delivered by module 250 is the transistor control signal delivered by circuit 330, or is obtained from this transistor control signal.

In the shown example, module 250 further delivers a signal SVGH1 which is the inverse of signal SVGH. Signal SVGH1 is referenced to the potential of node VGH. Preferably, the signal SVGH1 delivered by module 250 is the transistor control signal delivered by circuit 340, or is obtained from this transistor control signal.

A specific example of module 250 for controlling transistor 201 (FIG. 2) has been described hereabove. This example is not limiting, and module 250 may be formed by any circuit capable of controlling transistor 201 to the desired state represented by signal SGND and to limit the control voltage VGSP of transistor 201 to a value smaller than voltage V1 (FIG. 2). Preferably, module 250 is powered between nodes VGH and GND.

Module 260 comprises circuits 320, 350, 360. Each circuit 320, 350, 360 comprises, connected electrically in series in this order between nodes VGH and VGL: a fourth respective transistor 324, 354, 364; a fifth respective transistor 325, 355, 365; and a sixth respective transistor 326, 356, 366. The fifth transistors 325, 355, 365 each have their control terminal coupled, preferably connected, to node 245 for supplying DC voltage V2.

Preferably, the fifth and sixth transistors 325, 326, 355, 356, 365, and 366 are N-type field-effect transistors and have their source terminals located on the side of node VGL. Preferably, the fourth transistors 324, 354, and 364 are P-type field-effect transistors and have their source terminals located on the side of node VGH.

Each of circuits 320, 350, and 360 generates a transistor control signal. Each of circuits 320, 350, and 360 has a transistor control output formed by a connection node between the fifth and sixth transistors, respectively, 325 and 326, 355 and 356, and 365 and 366.

More particularly, circuit 320 controls transistor 202 (FIG. 2), circuit 350 controls transistors 326 and 366, and circuit 360 controls transistor 356.

Preferably, each of circuits 320, 350, and 360 comprises, in series between its transistor control output and node VGL, a Zener diode, respectively 328, 358, and 368, and a resistive element, respectively 329, 359, and 369. Zener diodes 328, 358, and 368 have their anodes facing node VGL.

In each of circuits 320, 350, and 360, the fourth transistor, respectively 324, 354, and 364, and the sixth transistor, respectively 326, 356, and 366, are reverse-controlled. Circuits 320, 350, and 360 are powered between nodes VGH and VGL.

When the fourth transistor, respectively 324, 354, and 364, is in the on state, the fifth transistor, respectively 325, 355, and 365 holds the potential of the connection node between the fifth transistor, respectively 325, 355, and 365, and the sixth transistor, respectively 326, 356, and 366, at a value smaller than that of the potential of node 245, for example, equal to that of the potential of node 245 minus a threshold turn-on voltage of the fifth transistor, respectively 325, 355, and 365. Thus, the transistor control voltage delivered by each of circuits 320, 350, and 360 is limited by voltage V2.

In each of circuits 320, 350, and 360, Zener diodes 328, 358, and 368 are used to avoid for the control signal delivered by the circuit to be floating when the fifth transistor, respectively 325, 355, and 365, and the sixth transistor, respectively 326, 356, and 366, are in the off state. The values of Zener diodes 328, 358, and 368 are selected so that the transistor control voltage delivered by circuit 320, 350, or 360 when the Zener diode is on is sufficient to turn on the concerned controlled transistor and to limit, that is, clamp, this control voltage to values smaller than a threshold of the control voltage admissible by the controlled transistor, with no deterioration.

The shown example is not limiting, Zener diodes 328, 358, and 368 and resistors 329, 359, and 369 may be omitted or replaced with any element capable of avoiding for the outputs of circuits 320, 350, and 360 to be floating.

The fourth transistor 354 of circuit 350 is controlled by signal SVGH1. The fourth transistor 324 of circuit 320 is controlled by a signal SVGH. The fourth transistor 364 of circuit 360 is controlled by signal SVGH.

In the shown example, circuits 350 and 360 control a state of the sixth transistor 326 of circuit 320 for controlling transistor 202 (FIG. 2) which is the inverse of that of the fourth transistor 324 controlled by signal SVGH. This example is not limiting, and circuits 350 and 360 may be replaced with any circuit configured to deliver to the sixth transistor 326 a control to a state which is the inverse of the state of the fourth transistor 324.

In the shown example, circuit 360 controls the sixth transistor 356 of circuit 350 to a state which is the inverse of that imposed to the fourth transistor 354 of circuit 350 by signal SVGH1. This example is not limiting, and circuit 360 may be replaced with any circuit configured to control the sixth transistor 356 of circuit 350 to a state which is the inverse of that of fourth transistor 354.

In the shown example, circuit 350 controls the sixth transistor 366 of circuit 360 to a state which is the inverse of that imposed to the fourth transistor 364 of circuit 360 by signal SVGH. An advantage is that the sixth transistors 356 and 366 of circuits 350 and 360 form a latch.

Although, in the shown example, signal SVGH1 is output by module 250, signal SVGH1 may be generated in module 260 by any adapted circuit, for example, powered between the power supply nodes VGH and VGL of module 260.

A specific example of a module 260 for controlling transistor 202 has been described hereabove (FIG. 2). This example is not limiting, and module 260 may be formed by any circuit capable of controlling transistor 202 to the desired state represented by signal SVGH and to limit the control voltage VGSN of transistor 202 to a value lower than voltage V2 (FIG. 2). Preferably, module 260 is powered between nodes VGH and VGL.

Figure 4:
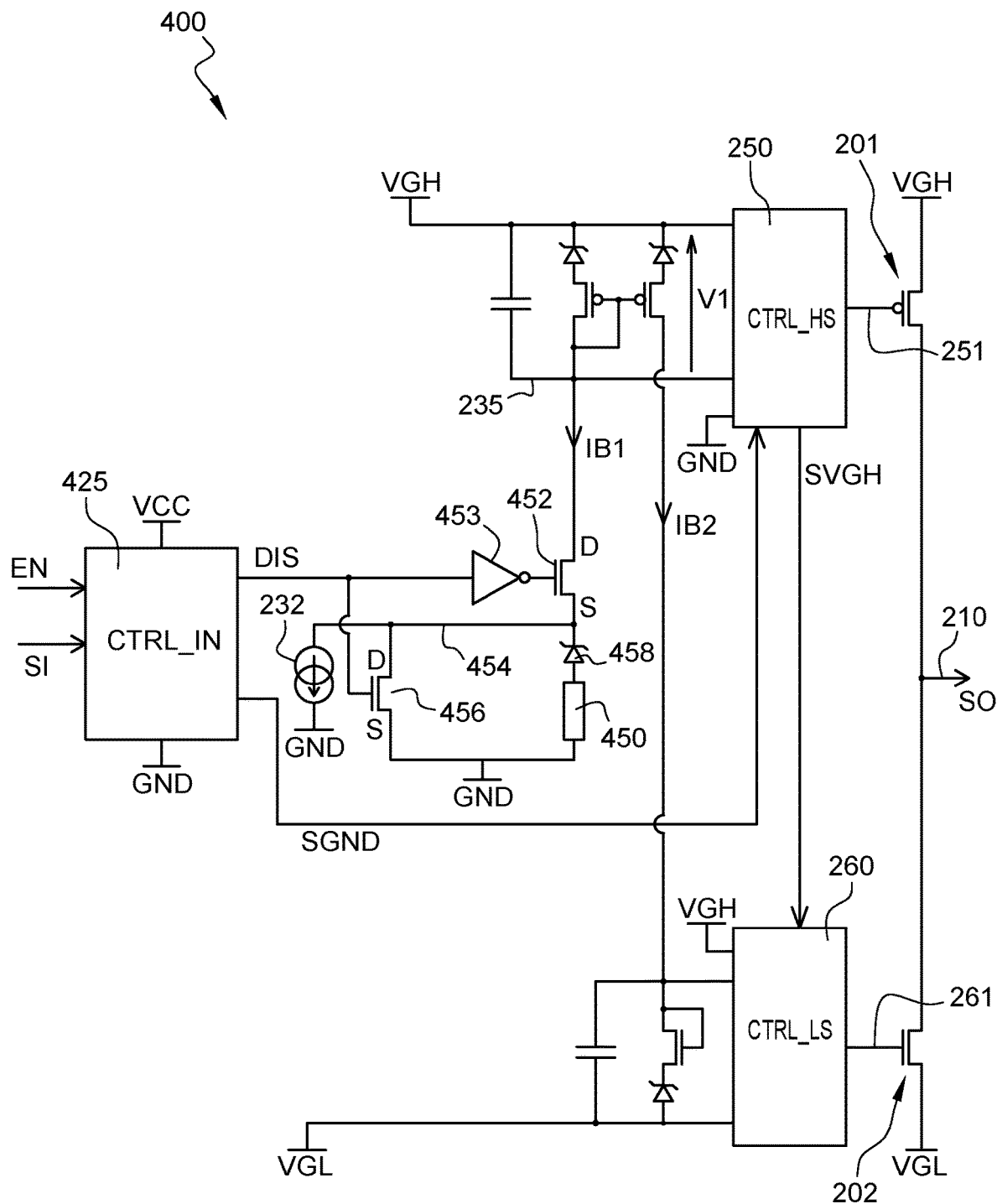
FIG. 4 partially and schematically shows another embodiment of a level shifter.

FIG. 4 partially and schematically shows another embodiment of a level shifter 400. Level shifter 400 may be used instead of one of the level shifters 142-i of the device 100 of FIG. 1. Level shifter 400 comprises same elements as level shifter 200 of FIG. 2 and, in particular, may comprise the modules 250 and 260 described in relation with FIG. 3. These elements will not be described again, only the differences are highlighted.

Level shifter 400 differs from the level shifter 200 of FIG. 2 in that logic circuit 225 is replaced with a logic circuit 425. Logic circuit 425 differs from the logic circuit 225 of the level shifter 200 of FIG. 2 in that, in addition to the delivery of signal SGND from signal SI, logic circuit 425 outputs a disable signal DIS. The disable signal may be obtained from an enable signal EN. In the case where level shifter 400 replaces one of the shifters 142-i of the device 100 of FIG. 1, enable signal EN may be delivered by digital unit 120 (FIG. 1).

In level shifter 400, node 235 is not directly connected to current source 232, but is coupled to the current source by a transistor 452, preferably an N-channel field-effect transistor. Transistor 452 has a drain terminal (D) facing node 235. Transistor 452 is controlled by an inverter 453 receiving disable signal DIS.

Preferably, a source terminal (S) of transistor 452 forms a connection node 454 between transistor 452 and current source 232. Nodes 454 and GND are coupled together by a transistor 456, preferably an N-channel field-effect transistor, having a source terminal (S) on the side of node GND. Transistor 456 is controlled by disable signal DIS.

Preferably, level shifter 400 further comprises a diode 458 and a resistive element 450, electrically in series between nodes 454 and GND, in other words in parallel with transistor 456.

In operation, when disable signal DIS is at a low level, transistor 452 is on. Current IB1 flows, which enables to obtain for DC voltages V1 and V2 voltages sufficient for the on/off state of transistors 201 and 202 to be controlled by modules 250 and 260 according to the desired state represented by signal SI. DC voltages V1 and V2 then have values greater than the turn-on voltage thresholds of the respective switches 201 and 202.

When the disable signal is in a high state, transistor 452 is turned off and voltages V1 and V2 are zero. As a result, the control voltages of transistors 201 and 202 are limited to the zero value, in other words, transistors 201 and 202 are simultaneously turned off and the output of level shifter 400 is in a floating potential state. Such a floating potential state is called high-impedance state.

In an image display method such as implemented by a device of the type of that in FIG. 1 where level shifters 142-i are replaced with level shifter 400, steps at which the control of display screen 110 (FIG. 1) is thus disabled may advantageously be provided.

The shown example is not limiting, and level shifter 400 may comprise, instead of transistors 452 and 456, of inverter 453, of diode 458, and of resistive element 459, any circuit configured to set DC voltages V1 and V2 to values smaller than the turn-on voltage thresholds of the respective transistors 201 and 202. In particular, this circuit enables to select the value of voltage V1 according to the level of signal DIS or of signal EN between two values smaller and greater than the control voltage threshold VGSP of transistor 201.

Figure 5:
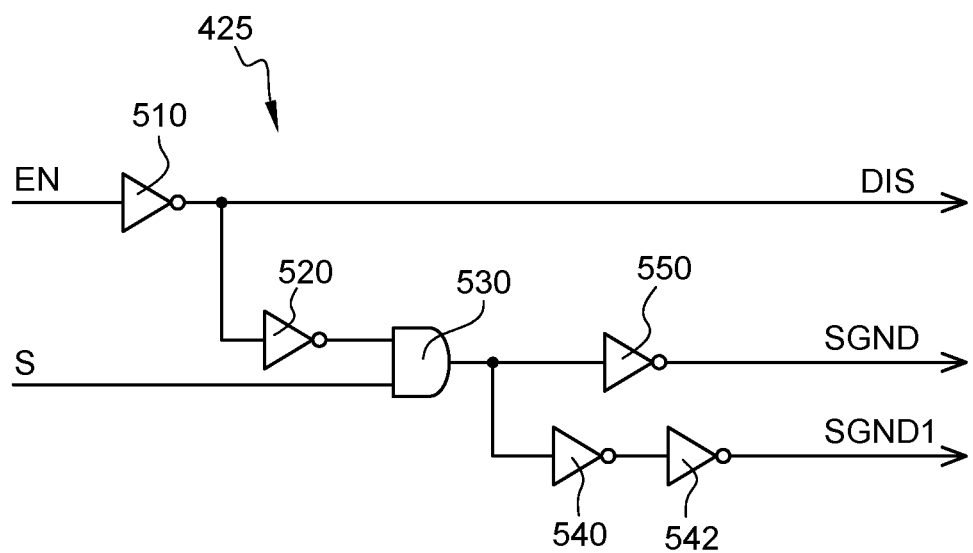
FIG. 5 schematically shows an example of circuit of the shifter of FIG. 4.

FIG. 5 schematically shows an example of the logic circuit 425 of the level shifter 400 of FIG. 4. More particularly, the shown logic circuit 425 corresponds to the example where signal SGND1 (FIG. 3) is delivered to module 250. Logic circuit 425 outputs signal SGND1 in addition to the signals SGND and DIS shown in FIG. 4. Further, logic circuit 425 comprises active elements such as inverters and logic gates. These elements are powered between nodes VCC and GND, which nodes are not shown in FIG. 5.

Logic circuit 425 comprises: an inverter 510 receiving signal EN and delivering signal DIS; an inverter 520 receiving signal DIS; an AND logic 530 having an input coupled, preferably connected, to the output of inverter 520; an inverter 550 having its input coupled, preferably connected, to the output of AND logic gate 530, and delivering signal SGND; and inverters 540 and 542 in series, that is, forming a buffer circuit. The input of inverter 540 is coupled, preferably connected, to the output of AND logic gate 530, and the output of inverter 542 delivers signal SGND1.

Figure 6:
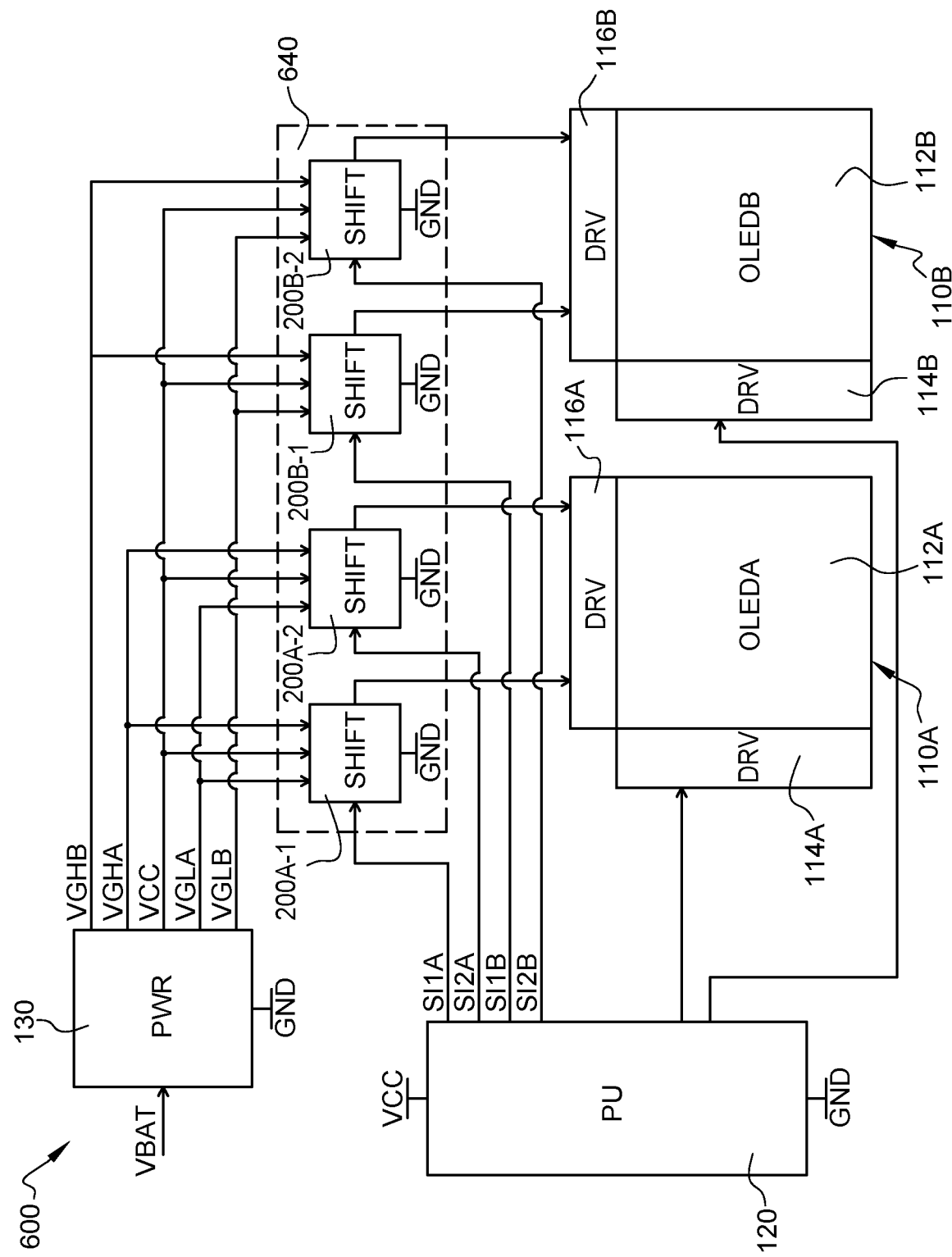
FIG. 6 schematically shows an embodiment of a device comprising level shifters.

FIG. 6 schematically shows an embodiment of a device 600 comprising level shifters.

Device 600 comprises elements identical or similar to those of the device 100 of FIG. 1. These elements will not be described in detail again. Only the differences are highlighted.

Device 600 differs from the device 100 of FIG. 1 in that: control device 600 comprises, instead of display screen 110, two display screens 110A (OLEDA) and 110B (OLEDB) each comprising a respective array of pixels 112A and 112B, a respective control circuit 114A and 114B, and another respective control circuit 116A and 116B; power supply module 130 delivers, instead of the potential of node VGH, different potentials on two nodes VGHA and VHGB and, instead of the potential of node VGL, different potentials on two nodes VGLA and VGLB; digital unit 120 delivers, instead of signals SIi, signals SIiA (SI1A and SI2A) for control circuit 116A, and signals SIiB (SI1B and SI2B) for control circuit 116B; and digital unit 120 is coupled, preferably connected, to control circuits 114A and 114B.

Display screens 110A and 110B may be of the type of display screen 110 (FIG. 1), arrays 112A and 112B corresponding to array 112, control circuits 114A and 114B corresponding to control circuit 114 (FIG. 1), and the other control circuits 116A and 116B corresponding to control circuit 116 (FIG. 1). Preferably, display screens 110A and 110B differ from each other in that display screen 110A is powered between nodes VGHA and VGLA which have potentials different from those of the nodes VGHB and VGLB of application of the power supply potentials of display screen 110B. For example, one of the potentials VGLA, VGLB is positive, and the other one of the potentials of nodes VGLA, VGLB is negative.

According to the present embodiment, an assembly 640 comprising a plurality of level shifters, all identical (to within manufacturing tolerances) is provided. In the shown example, assembly 604 comprises four level shifters 200A-1, 200A-2, 200B-1, 200B-2. The level shifters are similar or identical to the level shifters 200 of FIG. 2. Level shifters 200A-1, 200A-2, 200B-1, 200B-2 (SHIFT) may also all be similar or identical to the level shifter 400 of FIG. 4, additional links, not shown, then being provided between digital unit 120 and level shifters 400 to convey enable/disable signals.

Preferably, assembly 640 is a monolithic integrated circuit, that is, located inside and on top of a same semiconductor wafer portion. Preferably, assembly 640 is located in an integrated circuit package. Integrated circuit package means that this package, preferably tight, has areas of connection or pins of connection of the integrated circuit to other electronic circuits external to the package, for example, to a printed circuit board PCB.

Level shifters 200A-1 and 200A-2 are coupled, preferably connected, to nodes VCC, VGHA, and VGLA. Level shifters 200A-1 and 200A-2 form a level shifter bank delivering control signals to control circuit 116A. Level shifters 200B-1 and 200B-2 are coupled, preferably connected, to nodes VCC, VGHB, and VGLB. Level shifters 200B-1 and 200B-2 form a level shifter bank delivering control signals to control circuit 116B.

Although an example where assembly 640 comprises 4 identical level shifters forming two banks respectively associated with two display screens has been shown, a number of display screens greater than two may be provided. More than two level shifters per bank, that is, per display screen, may further be provided, for example, four or eight level shifters per display screen.

An advantage of device 600 is that it enables, from the same assembly 640, to connect various display screens powered between different high and low potentials, and the low potentials may, for a same assembly, have different signs for two different display screens.

Various embodiments and variants have been described. Those skilled in the art will understand that certain features of these various embodiments and variants may be combined, and other variants will occur to those skilled in the art. In particular, although embodiments where node VGH has a potential greater than that of node VGL and greater than that of node GND, other embodiments may be obtained by inverting the signs of the potentials (referenced with respect to the potential of node GND), by exchanging the N and P conductivity types of the transistor channels and by exchanging the anodes and cathodes of the diodes, the flowing directions of the currents in operation being further inverted.

Finally, the practical implementation of the described embodiments and variants is within the abilities of those skilled in the art based on the functional indications given hereabove. In particular, the selection of each transistor, more particularly the maximum drain-source voltage that the transistor is capable of blocking, may be done in usual fashion from the voltage/current levels that the transistor will have to block in the above-described operations.

The invention claimed is:

1. A circuit, comprising:
 a current mirror circuit including a first transistor coupled between a high supply potential node and a first intermediate node and a second transistor coupled between the high supply potential node and a second intermediate node, said second transistor having a control terminal coupled to a control terminal of the first transistor and the first intermediate node;
 a current source coupled between the first intermediate node and a ground node;
 a first capacitor coupled between the high supply potential node and the first intermediate node and configured to provide a first voltage;
 a third transistor coupled between the second intermediate node and a low supply potential node, the third transistor being a diode connected transistor with a control terminal coupled to the second intermediate node;
 a second capacitor coupled between the second intermediate node and the low supply potential node and configured to provide a second voltage;
 a first output transistor of p-channel type and a second output transistor of n-channel type connected at an output node, wherein the first and second output transistors are electrically in series between the high supply potential node and the low supply potential node;

a first drive circuit configured to generate a first control signal applied to a control terminal of the first output transistor, said first control signal having a first gate-to-source voltage for turning on the first output transistor, where the first gate-to-source voltage has a high limit controlled by the first voltage; and a second drive circuit configured to generate a second control signal applied to a control terminal of the second output transistor, said second control signal having a second gate-to-source voltage for turning on the second output transistor, where the second gate-to-source voltage has a high limit controlled by the second voltage.

2. The circuit according to claim 1, wherein the first drive circuit is powered between the high supply potential node and the ground node and wherein the second drive circuit is powered between the high supply potential node and the low supply potential node.

3. The circuit according to claim 1, wherein the first capacitor is connected in parallel with a series connection of the first transistor and a first diode, and wherein the second capacitor is connected in parallel with a series connection of the second transistor and a second diode.

4. The circuit according to claim 1, wherein the first drive circuit is configured to receive a third control signal referenced between a supply voltage node and the ground node, said first drive circuit level shifting the third control signal relative to the first voltage to generate the first control signal.

5. The circuit according to claim 4, wherein the second drive circuit further outputs a fourth control signal in response to the third control signal, and wherein the second drive circuit is configured to receive the fourth control signal, said second drive circuit level shifting the fourth control signal relative to the second voltage to generate the second control signal.

6. The circuit according to claim 1, wherein the first drive circuit comprises:

first, second, and third additional transistors electrically in series in order between the high supply potential node and the ground node, wherein a control terminal of the second additional transistor is coupled to the first intermediate node; and a node of interconnection between the first and second additional transistors where the first control signal is output.

7. The circuit according to claim 6, wherein the first drive circuit further comprises a latching circuit responsive to an input signal and having an output configured to generate a latch signal applied to drive a control terminal of the first additional transistor, and wherein said input signal is applied to a control terminal of the third additional transistor.

8. The circuit according to claim 1, wherein the second drive circuit comprises:

fourth, fifth, and sixth additional transistors electrically in series in order between the high supply potential node and the low supply potential node, wherein a control terminal of the fifth additional transistor is coupled to the second intermediate node; and a node of interconnection between the fifth and sixth additional transistors where the second control signal is output.

9. The circuit according to claim 8, wherein the second drive circuit further comprises a latching circuit responsive to an input signal and having an output configured to generate a latch signal applied to drive a control terminal of the sixth additional transistor, and wherein said input signal is applied to a control terminal of the fourth additional transistor.

* * * * *